(12) United States Patent
Jezewski et al.

(10) Patent No.: US 10,008,557 B2
(45) Date of Patent: Jun. 26, 2018

(54) VERTICAL MEANDER INDUCTOR FOR SMALL CORE VOLTAGE REGULATORS

(71) Applicant: Intel Corporation, Santa Clara, CA (US)

(72) Inventors: Christopher J. Jezewski, Portland, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/342,872

(22) Filed: Nov. 3, 2016

(65) Prior Publication Data

US 2017/0053977 A1 Feb. 23, 2017

Related U.S. Application Data

(63) Continuation of application No. 14/815,149, filed on Jul. 31, 2015, now Pat. No. 9,490,313, which is a (Continued)

(51) Int. Cl.
*H01L 21/00* (2006.01)
*H01L 23/00* (2006.01)
(Continued)

(52) U.S. Cl.
CPC .......... *H01L 28/10* (2013.01); *H01L 21/4814* (2013.01); *H01L 21/76898* (2013.01);
(Continued)

(58) Field of Classification Search
CPC .......... H01L 21/4814; H01L 21/76898; H01L 21/76877; H01L 23/5227; H01L 23/645;
(Continued)

(56) References Cited

U.S. PATENT DOCUMENTS 4,935,797 A   6/1990   Jambotkar
6,495,019 B1  12/2002  Filas et al.
(Continued)

FOREIGN PATENT DOCUMENTS

JP    11-150229       6/1999
WO    WO-2011/046887  4/2011

OTHER PUBLICATIONS

Final Office Action from U.S. Appl. No. 13/629,168 dated Dec. 13, 2013, 20 pgs.
(Continued)

*Primary Examiner* — Nikolay Yushin
(74) *Attorney, Agent, or Firm* — Schwabe, Williamson & Wyatt, P.C.

(57) ABSTRACT

Vertical meander inductors for small core voltage regulators and approaches to fabricating vertical meander inductors for small core voltage regulators are described. For example, a semiconductor die includes a substrate. An integrated circuit is disposed on an active surface of the substrate. An inductor is coupled to the integrated circuit. The inductor is disposed conformal with an insulating layer disposed on an essentially planar surface of the substrate. The insulating layer has an undulating topography.

7 Claims, 5 Drawing Sheets

Related U.S. Application Data continuation of application No. 14/319,429, filed on Jun. 30, 2014, now Pat. No. 9,129,844, which is a continuation of application No. 13/629,168, filed on Sep. 27, 2012, now Pat. No. 8,803,283.

(51) Int. Cl.
*H01L 49/02* (2006.01)
*H01L 23/48* (2006.01)
*H01L 21/768* (2006.01)
*H01L 23/64* (2006.01)
*H01L 21/48* (2006.01)
*H01L 23/522* (2006.01)

(52) U.S. Cl.
CPC ........ *H01L 23/481* (2013.01); *H01L 23/5227* (2013.01); *H01L 23/645* (2013.01); *H01L 2924/0002* (2013.01)

(58) Field of Classification Search
CPC ....... H01L 23/481; H01L 28/10; H01L 28/90; H01L 28/40; H01L 2924/0002; H01L 2924/00
See application file for complete search history.

(56) References Cited

U.S. PATENT DOCUMENTS

| | | | |
|---|---|---|---|
| 7,327,010 B2* | 2/2008 | Gardner | H01F 17/0006 257/528 |
| 7,518,481 B2* | 4/2009 | Gardner | H01F 17/0006 336/200 |
| 8,456,856 B2* | 6/2013 | Lin | H01L 23/60 257/686 |
| 8,686,522 B2 | 4/2014 | Webb | |
| 2002/0013005 A1 | 1/2002 | Rhee | |
| 2004/0140877 A1 | 7/2004 | Nakao et al. | |
| 2006/0038257 A1 | 2/2006 | Anzai | |
| 2006/0163695 A1 | 7/2006 | Gardner | |
| 2008/0020488 A1 | 1/2008 | Clevenger et al. | |
| 2008/0023824 A1 | 1/2008 | Salzman | |
| 2009/0007679 A1 | 1/2009 | Nunez et al. | |
| 2010/0078776 A1 | 4/2010 | Barth et al. | |
| 2010/0246152 A1 | 9/2010 | Lin et al. | |
| 2011/0298551 A1 | 12/2011 | Yen et al. | |
| 2012/0193607 A1 | 8/2012 | Wagner et al. | |
| 2013/0093032 A1 | 4/2013 | Webb | |

OTHER PUBLICATIONS

International Preliminary Report on Patentability from PCT/US2013/059045 dated Apr. 9, 2015, 9 pgs.
International Search Report and Written Opinion from PCT/US2013/059045 dated Dec. 30, 2013, 13 pgs.
Non-Final Office Action from U.S. Appl. No. 13/629,168 dated Aug. 6, 2013, 13 pgs.
Non-Final Office Action from U.S. Appl. No. 14/319,429 dated Dec. 23, 2014, 20 pgs.
Ex parte Quayle action from U.S. Appl. No. 14/815,149 dated Mar. 22, 2016, 7 pgs.
Search Report from Taiwan Patent Application No. 102133630 dated May 19, 2015, 13 pgs.

* cited by examiner

VERTICAL MEANDER INDUCTOR FOR SMALL CORE VOLTAGE REGULATORS

CROSS-REFERENCE TO RELATED APPLICATIONS

This application is a continuation of U.S. patent application Ser. No. 14/815,149, filed on Jul. 31, 2015, which is a continuation of U.S. patent application Ser. No. 14/319,429, filed on Jun. 30, 2014, now U.S. Pat. No. 9,129,844, issued on Sep. 8, 2015, which is a continuation of U.S. patent application Ser. No. 13/629,168, filed on Sep. 27, 2012, now U.S. Pat. No. 8,803,283, issued on Aug. 12, 2014, the entire contents of which are hereby incorporated by reference herein.

TECHNICAL FIELD

Embodiments of the invention are in the field of on-die inductors and, in particular, vertical meander inductors for small core voltage regulators.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

On-die voltage regulation is designed to automatically maintain a constant voltage level for an associated semiconductor die. A voltage regulator may be a simple "feed-forward" design or may include negative feedback control loops. It may use an electromechanical mechanism, or electronic components. Depending on the design, it may be used to regulate one or more AC or DC voltages.

Electronic components, such as inductors, may be implemented on substrates such as an integrated circuit die or a printed circuit board (PCB). Such implementations involve placing patterns of material (e.g., as conductive material) on one or more substrate layers. This placement may be through lithographic techniques. Inductors used for RF applications in complementary metal oxide semiconductor (CMOS) technology are typically air-core spiral inductors. Various drawbacks are associated with these inductors. For instance, air-core spiral inductors typically require a substantial amount of space (area) on a substrate (e.g., an IC die). Moreover, such inductors require a high-resistivity substrate.

Thus, significant improvements are still needed in the area of on-die inductors for voltage regulation.

DESCRIPTION OF THE EMBODIMENTS

Vertical meander inductors for small core voltage regulators and approaches to fabricating vertical meander inductors for small core voltage regulators are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are targeted to the fabrication of an undulating inductor for, e.g., voltage regulation via an on-die voltage regulator. Conventional voltage regulators may occupy a substantial volume. For example, large ferrite inductors running at low frequency have provided previous solutions for voltage regulation by including the large ferrite inductors as mounted on a motherboard. By contrast, new approaches include incorporation of a voltage regulator closer in proximity to a microprocessor. Such approaches have associated benefits such as, but not limited to, reduced inductor volume, system factor gains from increased ferromagnetic, minimization of $V_{droop}$, a fast response time and small volume to enable granularity, and improved overall efficiency.

Figure 1:
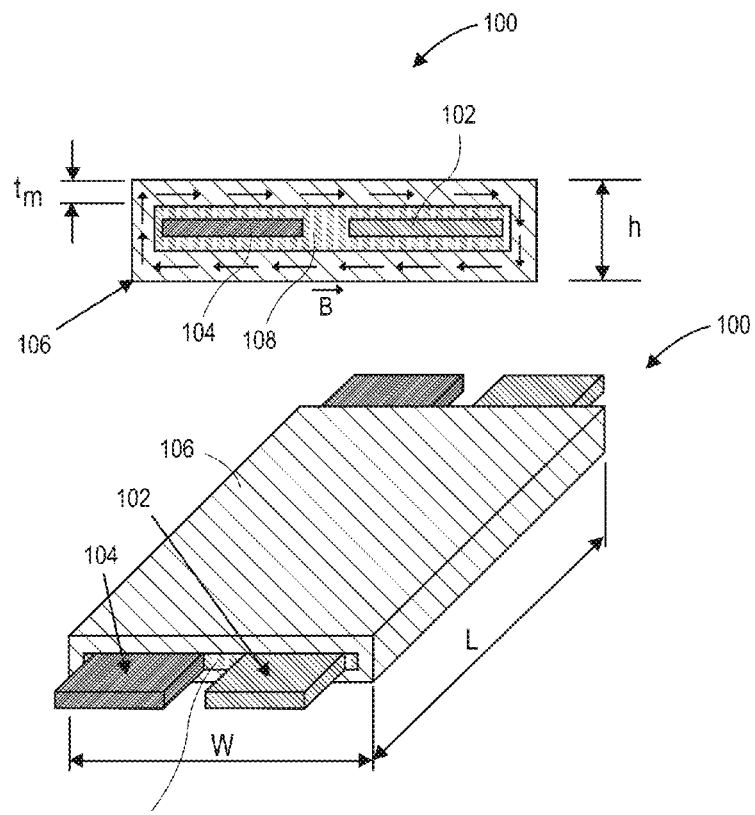
FIG. 1 illustrates an angled view and corresponding cross-sectional view of a strip-line inductor for on-die voltage regulation, in accordance with an embodiment of the present invention.

Accordingly, more recent approaches to voltage regulation for integrated circuits involves moving the voltage regulator on-die to allow improved voltage regulation performance. To this end, micro-strip (strip-line) inductors are being investigated. Strip-line inductors may offer the lowest DC resistance option (since they travel in a straight line) and inherent coupling which allows higher currents prior to magnetic saturation. As an example, FIG. 1 illustrates an angled view and corresponding cross-sectional view of a strip-line inductor for on-die voltage regulation, in accordance with an embodiment of the present invention. Referring to FIG. 1, a strip line inductor 100 includes conductive wires 102 and 104 (such as copper wires). In an example, wire 102 is an output winding for the inductor 100 and wire 104 is an input winding for inductor 100. The wires 102 and 104 are housed in a magnetic material 106 by an insulating layer 108. The inductor 100 has a height (h), a width (w), and a length (l). The magnetic material 106 has a thickness ($t_m$) and a magnetic field direction (B) shown by the arrows in the cross-sectional view of FIG. 1. Thus, the inductor 100 is a magnetic core inductor as opposed to an air core inductor.

Figure 2A:
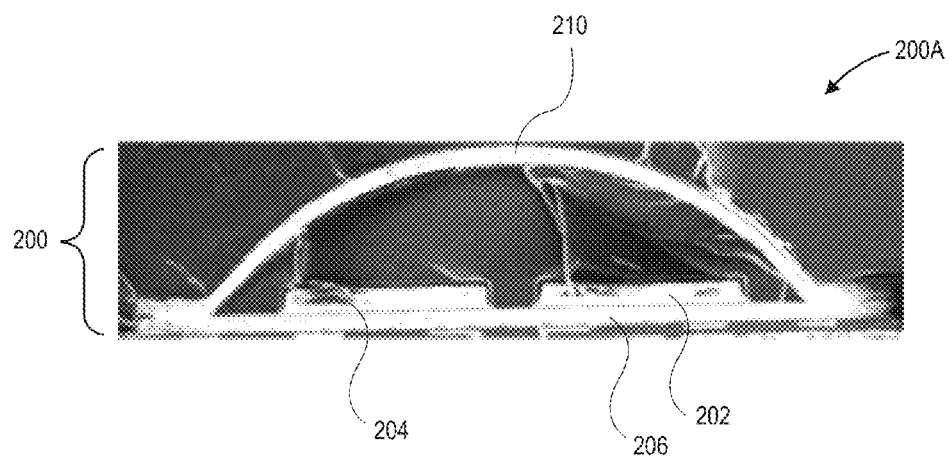
FIG. 2A is an SEM image of a cross-sectional view of a portion of an inductor structure, in accordance with an embodiment of the present invention.
Figures 2B, 2C:
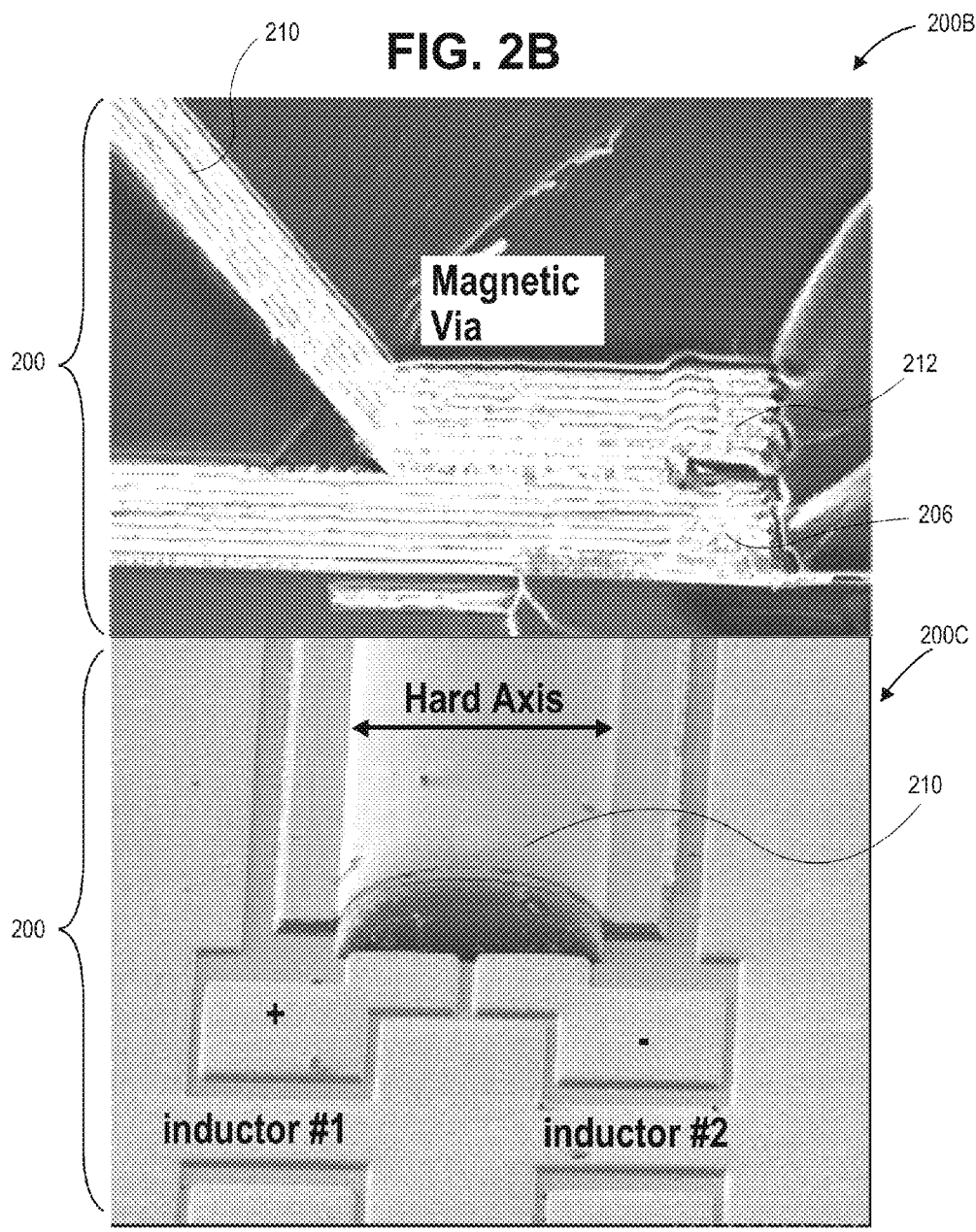
FIG. 2B is an SEM image of another cross-sectional view of a portion of an inductor structure, in accordance with an embodiment of the present invention.
FIG. 2C is an SEM image of a top angled view of an inductor structure, in accordance with an embodiment of the present invention.

FIGS. 2A-2C are scanning electron microscope (SEM) images of various views of a strip-line inductor, in accordance with an embodiment of the present invention. FIG. 2A is an SEM image 200A of a cross-sectional view of a portion of an inductor structure 200. Referring to FIG. 2A, first and second wires 202 and 204, such as output winding and input winding wires are housed in a magnetic dome 210, above a magnetic material 206. FIG. 2B is an SEM image 200B of another cross-sectional view of a portion of the inductor structure 200. Referring to FIG. 2B, a magnetic via 212 couples the magnetic dome 210 with the underlying magnetic material 206 to surround the wires 202 and 204 (wires not shown in this view). FIG. 2C is an SEM image of a top angled view of the inductor structure 200. Referring to FIG. 2C, more than one inductor may share the same magnetic material, such as inductors #1 and #2, depicted in FIG. 2C. Also seen is the top of magnetic dome 210.

Since an inductor structure is a key component in modern voltage regulator circuits based on buck or hybrid circuit topologies, the inductor structure needs to occupy less volume or real estate yet without impacting performance of the inductor structure, as components scale. To maximize efficiency during average and peak current loads, it may be necessary that the voltage regulator inductor area be equal to or less than the microprocessor core area. As such, currently there is no known inductor-based voltage regulator solution that will fit inside an XY layout area of future core products based on scaling of today's dimensions. An issue is that as the core (and other components such as graphics) shrink they may require more turbo current density (even though the overall power is dropping). Current materials for planar straight inductors may only be useful for the next generation or so, otherwise new material or multi-level inductors may be needed if planarity of the inductors is maintained. Although material solutions may address some efficiency gains, there may not be sufficient inductance (L) achieved upon shrinking of the associated inductor. Nonetheless, voltage regulation scaling may be critical to future products such as system-on-chip (SoC) components.

Thus, in an embodiment, the above described micro-strip or strip-line inductors may be further scaled to accommodate scaling in the semiconductor industry. For example, in accordance with an embodiment of the present invention, the wire strips (typically flat and straight) are provided with a meandering or undulating third dimension to provide a longer strip relative to a give planar surface dimension. As such, inductance is increased per XY area by shrinking area when the inductor meanders vertically. Such an approach may be used regardless of eventual location of the inductors, including the possibility to process on a wafer or substrate backside. Such embodiments may enable scaling of modern devices in volume, which will likely be accommodated by scaling of the voltage regulator as well.

Figure 3:
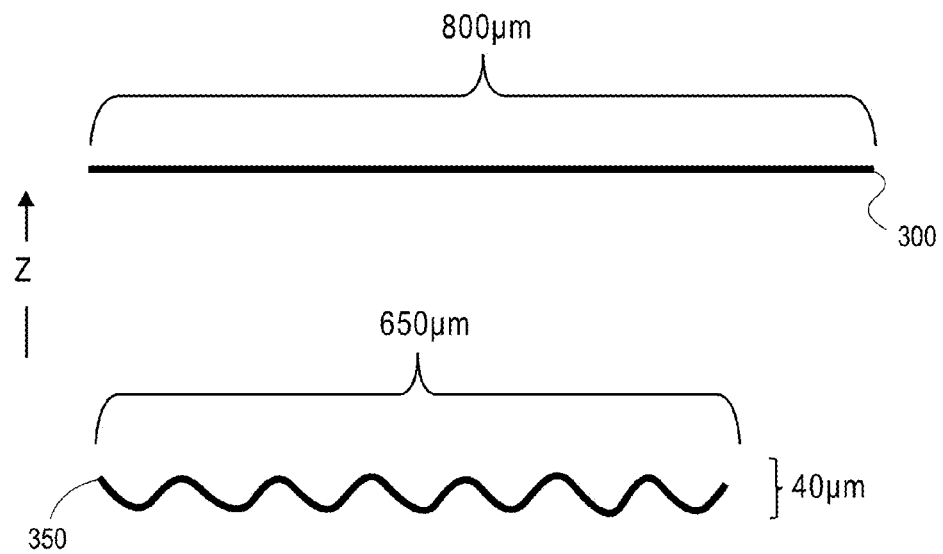
FIG. 3 illustrates scaling of a micro-strip or strip-line inductor from a total physical length of 800 microns to 650 microns by fabrication of an inductor that meanders vertically, in accordance with an embodiment of the present invention.

As an example, FIG. 3 illustrates scaling of a micro-strip or strip-line inductor from a total physical length of 800 microns to 650 microns by fabrication of an inductor that meanders vertically, in accordance with an embodiment of the present invention. Referring to FIG. 3, a planar or flat strip-line inductor 300 is shown to run a length of approximately 800 microns. Beyond thickness, the planar or flat strip-line inductor 300 has no dimension vertically, e.g., in the z-direction. By contrast, a meandering (or undulating) strip-line inductor 350 has a length of 800 microns, but only occupies approximately 650 microns in actual length. The meandering or undulating inductor has a dimension vertically (e.g., beyond mere thickness in the z-direction). For example, the inductor structure 350 meanders or undulates in the vertical direction by approximately 40 microns. This approach effectively accomplishes a shrink of the actual length (e.g., 650 microns instead of 800 microns) needed to accommodate the inductor 350 without actually reducing the length (e.g., 800 microns) of the inductor 350.

Figure 4A:
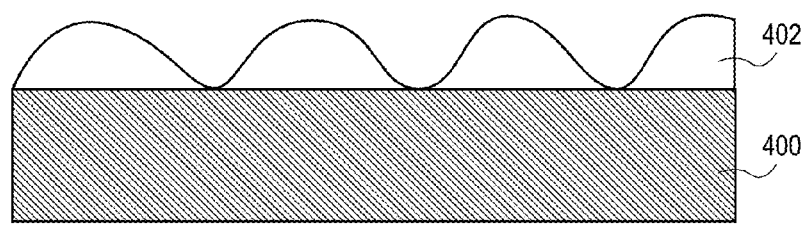
FIGS. 4A and 4B illustrate cross-sectional views of operations in, and the resulting structure of, a method of fabricating a meandering inductor, in accordance with an embodiment of the present invention.
Figure 4B:
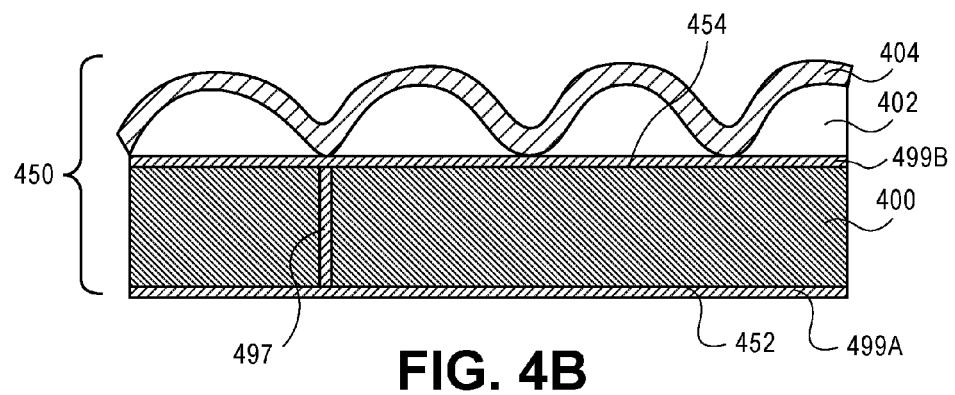

In a first example, FIGS. 4A and 4B illustrate cross-sectional views of operations in, and the resulting structure of, a method of fabricating a meandering inductor, in accordance with an embodiment of the present invention.

Referring to FIG. 4A, an insulating layer 402, such as a layer of silicon dioxide, is formed above a substrate 400, such as a silicon substrate of a semiconductor die. The insulating layer 402 is formed to have an undulating topography. In an embodiment, the undulating topography of the insulating layer 402 is formed by reflow of a lithographically patterned insulating layer. In another embodiment, the undulating topography of the insulating layer 402 is formed by using grayscale lithography.

In the latter case, using grayscale lithography, three-dimensional microstructures are formed in a thick layer of photoresist. The fastest and easiest way to perform this is with a maskless laser lithography system, which uses an intensity modulated laser beam to write the structures directly into the resist. The resist is applied to the insulating layer of the substrate by spin- or spray-coating and can be several hundred microns thick, but most applications only require a thickness of less than 50 microns. Using data from an electronic design, the laser lithography system exposes the resist with a variable dose and the three-dimensional structures remain in the resist after the development process. The final result of this entire process depends on the electronic data, the laser writing and the development, and all of these operations can be independently tuned to produce the best result. The optical structures in the photoresist can subsequently be transferred into insulating layer on the substrate by reactive ion etching. In another embodiment, however, gray tone masks are used to pattern the insulating layer to have an undulating topography.

Referring to FIG. 4B, a meandering inductor structure 404, such as a meandering version of the strip-line inductors described in association with FIGS. 1 and 2A-2C is formed above the insulating layer 402 having the undulating topography. Thus, in an embodiment, a semiconductor die 450 includes a substrate 400. An integrated circuit 499A or 499B is disposed on an active surface (452 or 454, respectively) of the substrate 400. The inductor 404 is coupled to the integrated circuit 499A or 499B. The inductor 404 is disposed conformal with the insulating layer 402 disposed on an essentially planar surface of the substrate 400. However, the insulating layer 402 has an undulating topography.

In one such embodiment, the insulating layer 402 having the undulating topography is disposed above the active surface of the substrate 400, above the integrated circuit 499B, in which case the integrated circuit is formed on active surface 454. In another such embodiment, the insulating layer 402 having the undulating topography is disposed on a back surface of the substrate 400, in which case the integrated circuit 499A is formed on active surface 452. In a specific embodiment of the latter arrangement, the inductor 404 is coupled to the integrated circuit 499A on active surface 452 by one or more through silicon vias 497 disposed in substrate 400.

Figure 5A:
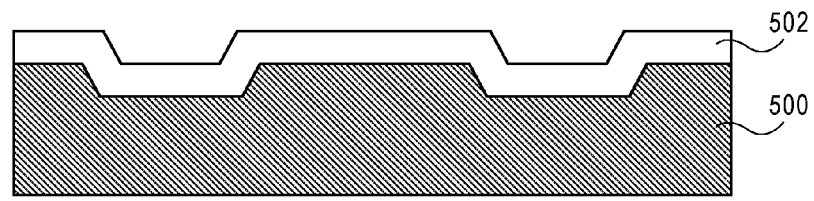
FIGS. 5A and 5B illustrate cross-sectional views of operations in, and the resulting structure of, another method of fabricating a meandering inductor, in accordance with an embodiment of the present invention.
Figure 5B:
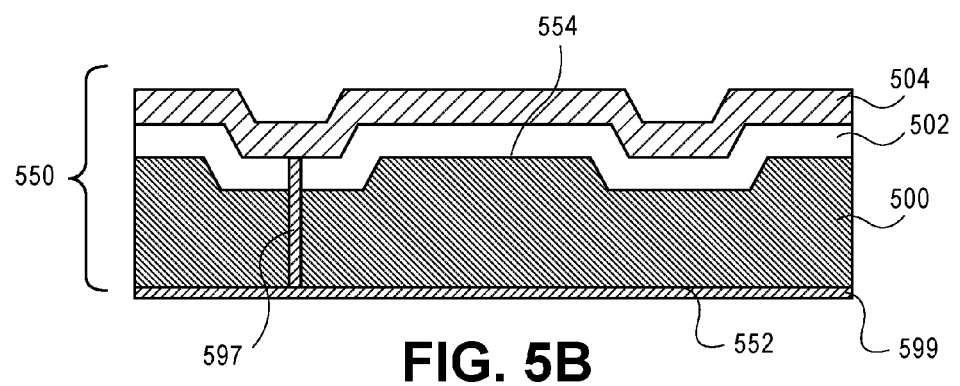

In a second example, FIGS. 5A and 5B illustrate cross-sectional views of operations in, and the resulting structure of, another method of fabricating a meandering inductor, in accordance with an embodiment of the present invention.

Referring to FIG. 5A, a substrate 500, such as a silicon substrate of a semiconductor die, is formed to have an undulating topography. In an embodiment (as shown), an insulating layer 502, such as a layer of silicon dioxide, is formed above the substrate 500, conformal with the undulating topography. In one embodiment, the undulating topography is faceted, as depicted in FIG. 4A. However, in other embodiments, the undulating topography of the substrate 500 is not faceted.

In an embodiment, the undulating topography of the substrate 500 is formed by etching a silicon substrate. In one such embodiment, isotropic etching is used which involves an etching process which progresses at the same speed in all directions. In another embodiment, long and narrow holes in a mask are used to produce v-shaped grooves in the silicon substrate. The surface of these grooves can be atomically smooth if the etch is carried out correctly, with dimensions and angles being extremely accurate. In another embodiment, anisotropic etching is used. For example, some single crystal materials, such as silicon, have different etching rates depending on the crystallographic orientation of the substrate. This is known as anisotropic etching and one of the most common examples is the etching of silicon in KOH (potassium hydroxide), where Si <111> planes etch approximately 100 times slower than other planes (crystallographic orientations). Therefore, etching a rectangular hole in a (100)-Si wafer results in a pyramid shaped etch pit with 54.7° walls, instead of a hole with curved sidewalls as with isotropic etching. In other embodiments, dry etching, such as vapor or plasma etching is used.

Referring to FIG. 5B, a meandering inductor structure 504, such as a meandering version of the strip-line inductors described in association with FIGS. 1 and 2A-2C is formed above the surface of the substrate having the undulating topography. Thus, in an embodiment, a semiconductor die 550 includes a substrate 500. An integrated circuit (not shown) is disposed on an active surface 552 of the substrate 500. The inductor 504 is coupled to the integrated circuit. The inductor 504 is disposed conformal with a back surface 554 of the substrate 500, the back surface having the undulating topography.

In one such embodiment, the inductor is disposed on an insulating layer 502 disposed on the back surface 554 of the substrate 500. The insulating layer 502 is conformal with the back surface 554 having the undulating topography, as depicted in FIG. 5B. In an embodiment, the inductor 504 is coupled to the integrated circuit 599 on active surface 552 by one or more through silicon vias 597 disposed in substrate 500 in a manner similar to the arrangement described for and depicted in FIG. 4B.

More generally, various embodiments described herein may be directed to techniques involving electronic components fabrication. For instance, in some embodiments, an apparatus may include a first magnetic layer, a second magnetic layer, and a conductive pattern. The conductive pattern is at a third layer between the first and second magnetic layers, and is composed of a metal such as copper or aluminum. Moreover, one or more magnetic vias connect the first and second magnetic layers. In some embodiments, the magnetic layers and vias may operate as ferromagnetic cores or shields, e.g., and may be composed of materials that can be formed to have ferromagnetism such as Co, Ni, or iron oxide. Furthermore, the magnetic layers and vias may be integrated on a chip (e.g., for on-die magnetics). Also, they may be implemented with CMOS technology or processes or, alternatively, on lower cost panel level processing. The apparatus may be included in inductors, transformers, transmission lines, RF circuits, wireless applications, voltage regulators and so forth.

As described herein, embodiments may advantageously provide inductors of comparable or better performance than current approaches, and that have a much smaller footprint. Furthermore, some embodiments enable avoidance of the blockage of space underneath inductors. Also, some embodiments may be implemented with low-resistivity substrates. This allows, for example, co-integration of digital and RF circuits using a high-speed CMOS process.

Moreover, embodiments may provide inductors that may be used at lower frequencies. Exemplary lower frequency applications may include switching amplifiers used as envelope generators for high-efficiency RF power amplifiers. Such applications may involve modulation schemes requiring class-A linear RF power amplifiers, which have a theoretical efficiency of less than 12.5%. Other applications include resonant gate drivers for high-power DC-DC converters, low to mid-power on-die DC-DC converters. Furthermore, inductors described herein may be an integral collateral for system-on-chip (SoC) designers.

Figure 6:
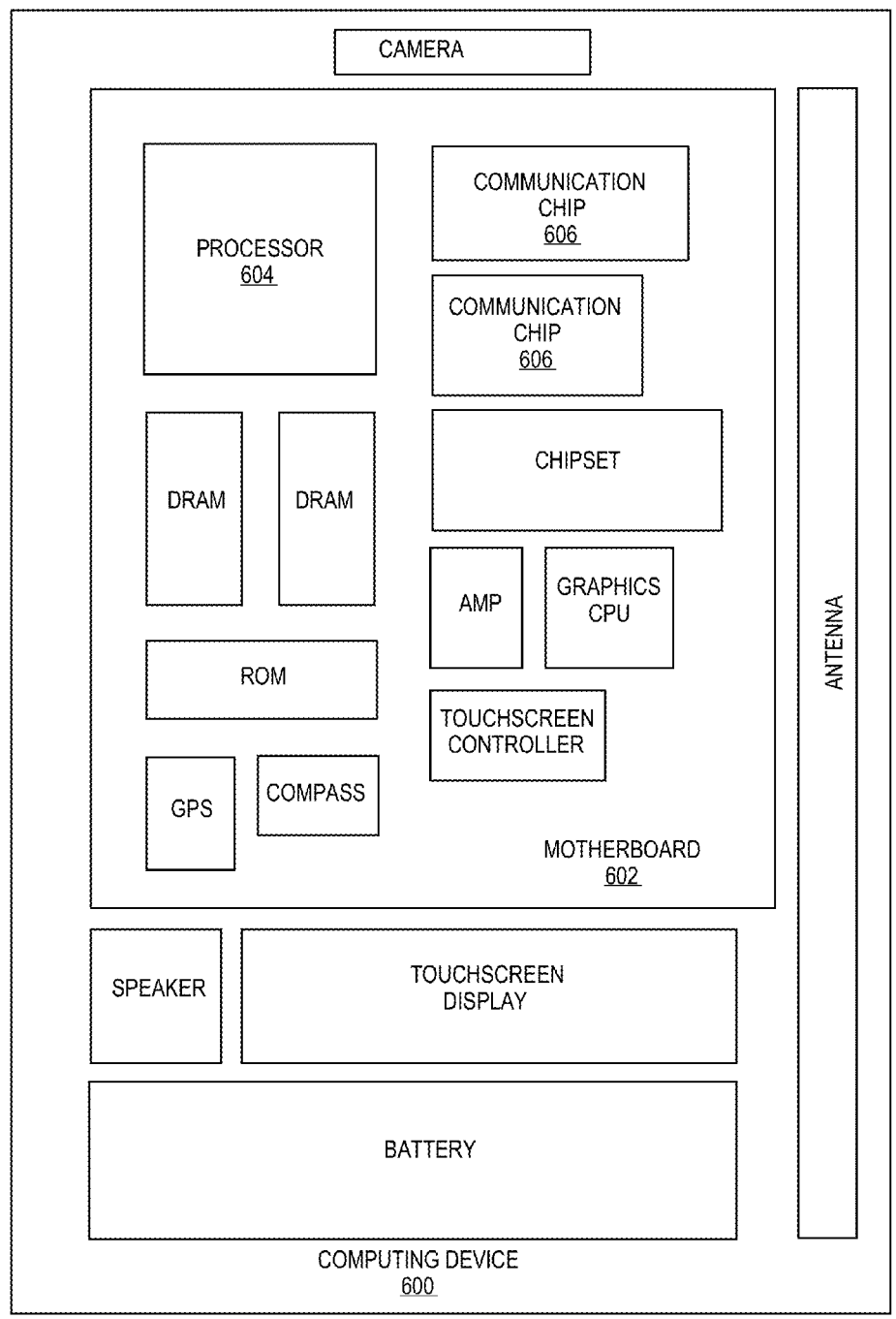
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more passive devices, such as on-die inductors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more passive devices, such as on-die inductors built in accordance with implementations of the invention.

In further implementations, another component housed within the computing device 600 may contain an integrated circuit die that includes one or more passive devices, such as on-die inductors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The specific implementations described above are not meant to be limiting to the spirit and scope of embodiments of the present invention. For example, in another embodiment, a voltage regulator (VR) circuit is included as a separate chip—often referred to as a power management integrated circuit (PMIC) chip. Another embodiments includes using of surface mount meandering inductors on a package, yet using transistors of an associated IC for switches. Another embodiment includes surface mount of an entire VR on a package or embedded in a package.

Thus, embodiments of the present invention include vertical meander inductors for small core voltage regulators and approaches to fabricating vertical meander inductors for small core voltage regulators.

In an embodiment, a semiconductor die includes a substrate. An integrated circuit is disposed on an active surface of the substrate. An inductor is coupled to the integrated circuit. The inductor is disposed conformal with an insulating layer disposed on an essentially planar surface of the substrate. The insulating layer has an undulating topography.

In one embodiment, the insulating layer having the undulating topography is disposed on a back surface of the substrate.

In one embodiment, the inductor is coupled to the integrated circuit by one or more through silicon vias (TSVs) disposed in the substrate.

In one embodiment, the insulating layer having the undulating topography is disposed above the active surface of the substrate, above the integrated circuit.

In one embodiment, the inductor is a magnetic core inductor.

In one embodiment, the inductor is included in an on-die voltage regulator.

In an embodiment, a semiconductor die includes a substrate. An integrated circuit is disposed on an active surface of the substrate. An inductor is coupled to the integrated circuit. The inductor is disposed conformal with a back surface of the substrate, the back surface having an undulating topography.

In one embodiment, the inductor is disposed on an insulating layer disposed on the back surface of the substrate. The insulating layer is conformal with the back surface having the undulating topography.

In one embodiment, the inductor is coupled to the integrated circuit by one or more through silicon vias (TSVs) disposed in the substrate.

In one embodiment, the undulating topography of the back surface is faceted.

In one embodiment, the undulating topography of the back surface is non-faceted.

In one embodiment, the inductor is a magnetic core inductor.

In one embodiment, the inductor is included in an on-die voltage regulator.

In an embodiment, a method of fabricating a semiconductor structure includes forming an integrated circuit on an active surface of a substrate. The method also includes forming an insulating layer on an essentially planar surface of the substrate, the insulating layer having an undulating topography. The method also includes forming an inductor coupled to the integrated circuit, the inductor formed conformal with the insulating layer.

In one embodiment, forming the insulating layer having the undulating topography includes reflowing a lithographically patterned insulating layer.

In one embodiment, forming the insulating layer having the undulating topography includes using grayscale lithography.

In one embodiment, forming the insulating layer having the undulating topography includes forming the insulating layer on a back surface of the substrate.

In one embodiment, forming the inductor coupled to the integrated circuit includes coupling the inductor to the integrated circuit by one or more through silicon vias (TSVs) formed in the substrate.

In one embodiment, forming the insulating layer having the undulating topography includes forming the insulating layer above the active surface of the substrate, above the integrated circuit.

In one embodiment, forming the inductor includes forming a magnetic core inductor.

In one embodiment, forming the inductor includes forming an on-die voltage regulator.

In an embodiment, a method of fabricating a semiconductor structure includes forming an integrated circuit on an active surface of a substrate. The method also includes forming an undulating topography on a back surface of the substrate. The method also includes forming an inductor coupled to the integrated circuit, the inductor formed conformal with the back surface of the substrate.

In one embodiment, forming the undulating topography on the back surface of the substrate includes using an isotropic etch of a silicon substrate.

In one embodiment, forming the undulating topography on the back surface of the substrate includes using an isotropic etch of a silicon substrate.

In one embodiment, the method further includes, prior to forming the inductor, forming an insulating layer conformal with the back surface having the undulating topography. The inductor is formed on the insulating layer formed on the back surface of the substrate.

In one embodiment, forming the inductor coupled to the integrated circuit includes coupling the inductor to the integrated circuit by one or more through silicon vias (TSVs) formed in the substrate.

In one embodiment, forming the undulating topography includes forming a faceted topography.

In one embodiment, forming the undulating topography includes forming a non-faceted topography.

In one embodiment, forming the inductor includes forming a magnetic core inductor.

In one embodiment, forming the inductor includes forming an on-die voltage regulator.

What is claimed is:

1. A semiconductor die, comprising:
   a substrate;
   an integrated circuit disposed on an active front surface of the substrate;
   an inductor coupled to the integrated circuit, the inductor disposed on and conformal with an insulating layer disposed on and conformal with, but not through, a back surface of the substrate, wherein the back surface of the substrate has a non-planar topography, wherein both an uppermost surface and a lowermost surface of the insulating layer have the non-planar topography, and wherein both an uppermost surface and a lowermost surface of the inductor have the non-planar topography; and
   one or more conductive vias disposed through the substrate, the one or more conductive vias electrically coupling the inductor to the integrated circuit.

2. The semiconductor die of claim 1, wherein the non-planar topography of the back surface, the non-planar topography of the uppermost surface and the lowermost surface of the insulating layer, and the non-planar topography of the uppermost surface and the lowermost surface of the inductor is based on a faceted topography.

3. The semiconductor die of claim 1, wherein the non-planar topography of the back surface, the non-planar topography of the uppermost surface and the lowermost surface of the insulating layer, and the non-planar topography of the uppermost surface and the lowermost surface of the inductor is based on a non-faceted topography.

4. The semiconductor die of claim 1, wherein the inductor is a magnetic core inductor.

5. The semiconductor die of claim 1, wherein the inductor is included in an on-die voltage regulator.

6. The semiconductor die of claim 1, wherein the substrate is a silicon substrate, and wherein the one or more conductive vias are one or more through silicon vias (TSVs).

7. The semiconductor die of claim 1, wherein the insulating layer comprises a layer of silicon dioxide.

* * * * *